(12) United States Patent
Zhang et al.

(10) Patent No.: US 11,921,412 B2
(45) Date of Patent: Mar. 5, 2024

(54) METHOD FOR MANUFACTURING PROJECTION SCREEN AND PROJECTION SCREEN

(71) Applicant: APPOTRONICS CORPORATION LIMITED, Guangdong (CN)

(72) Inventors: Hongxiu Zhang, Guangdong (CN); Wei Sun, Guangdong (CN); Kejian Cui, Guangdong (CN); Yi Li, Guangdong (CN)

(73) Assignee: APPOTRONICS CORPORATION LIMITED, Guangdong (CN)

( * ) Notice: Subject to any disclaimer, the term of this patent is extended or adjusted under 35 U.S.C. 154(b) by 438 days.

(21) Appl. No.: 17/413,372

(22) PCT Filed: Nov. 18, 2019

(86) PCT No.: PCT/CN2019/119136
§ 371 (c)(1),
(2) Date: Oct. 25, 2021

(87) PCT Pub. No.: WO2020/119395
PCT Pub. Date: Jun. 18, 2020

(65) Prior Publication Data
US 2023/0161239 A1    May 25, 2023

(30) Foreign Application Priority Data
Dec. 12, 2018  (CN) .......................... 201811516648.9

(51) Int. Cl.
*G03B 21/60*    (2014.01)
*C23C 14/35*    (2006.01)

(52) U.S. Cl.
CPC .............. *G03B 21/60* (2013.01); *C23C 14/35* (2013.01)

(58) Field of Classification Search
None
See application file for complete search history.

(56) References Cited

U.S. PATENT DOCUMENTS

| 2012/0008201 A1 | 1/2012 | Shiau et al. |
| 2019/0324363 A1 | 10/2019 | Ku et al. |

FOREIGN PATENT DOCUMENTS

| CN | 1653385 | 8/2005 | |
| CN | 1653385 A | * 8/2005 | ............. G03B 21/60 |

(Continued)

OTHER PUBLICATIONS

Chinese Office Action for 201811516648.9, dated Nov. 16, 2021, (8 pages).

(Continued)

*Primary Examiner* — Bao-Luan Q Le
*Assistant Examiner* — Danell L Owens
(74) *Attorney, Agent, or Firm* — NIXON PEABODY LLP; Jeffrey L. Costellia

(57) ABSTRACT

A method for manufacturing a projection screen and a projection screen are provided. The method includes: preparing a substrate; under a first preparation condition, forming a reflective layer by vacuum plating above the substrate; and under a second preparation condition, forming a diffusion layer by the vacuum plating on the reflective layer. The second preparation condition is different from the first preparation condition, and a sputtering power in the second preparation condition is higher than a sputtering power in the first preparation condition.

17 Claims, 3 Drawing Sheets

(56) References Cited

FOREIGN PATENT DOCUMENTS

| | | |
|---|---|---|
| CN | 1693989 | 11/2005 |
| CN | 103422054 | 12/2013 |
| CN | 205247047 | 5/2016 |
| CN | 106990665 | 7/2017 |
| CN | 108285750 | 7/2018 |
| JP | 2003-302704 | 10/2003 |
| TW | M374077 | 2/2010 |

OTHER PUBLICATIONS

International Search Report for PCT/CN2019/119136, dated Feb. 17, 2020.

\* cited by examiner

METHOD FOR MANUFACTURING PROJECTION SCREEN AND PROJECTION SCREEN

TECHNICAL FIELD

The present disclosure relates to a method for manufacturing a projection screen and a projection screen.

BACKGROUND

Reflective projection screen is a widely used projection screen. In order to eliminate glare, a metal film is usually plated on a surface of the substrate of the conventional projection screen, and a diffusion film is attached to a surface of the metal film, so as to realize the scattering and reflection of incident light. However, in this structure, the angular size of the surface structure of the diffusion film is required to be controlled, and thus the manufacturing process is difficult and costly.

SUMMARY

To solve the problem that the above manufacturing process of the projection screen is difficult, costly, and is difficult to control the diffusion angle, the present disclosure provides a reflective screen and a manufacturing method thereof, which can be used for movie screens and home screens and have the beneficial effects of simple manufacturing process and low cost.

In a first aspect of the present disclosure, a method for manufacturing a projection screen is provided, including:
   step S1: preparing a substrate;
   step S2: under a first preparation condition, forming a reflective layer by vacuum plating above the substrate; and
   step S3: under a second preparation condition, forming a diffusion layer by the vacuum plating on the reflective layer,
   wherein the second preparation condition is different from the first preparation condition, and a sputtering power in the second preparation condition is greater than a sputtering power in the first preparation condition.

With the method for manufacturing the projection screen and the structure of the projection screen of the present disclosure, the reflective layer and the diffusion layer are formed of the same material, and integrally form a composite body that can realize a reflective layer having its own concave-convex structure. Accordingly, an additional diffusion film is not required to be attached or formed on the projection screen, a concave-convex structure is not required to be formed on the substrate by sandblasting, etching, etc., and diffusion particles are not required to be doped in the reflective layer. Therefore, the projection screen of the present disclosure has the beneficial effects of simple manufacturing and low cost.

In addition, the reflective layer and the diffusion layer of the projection screen of the present disclosure are prepared by the same preparation method, both using vacuum deposition process and the same optical material, which can solve the problem of bonding failure of the diffusion layer and the reflective layer in the prior art due to different materials and different processes thereof.

DESCRIPTION OF EMBODIMENTS

Figure 1:
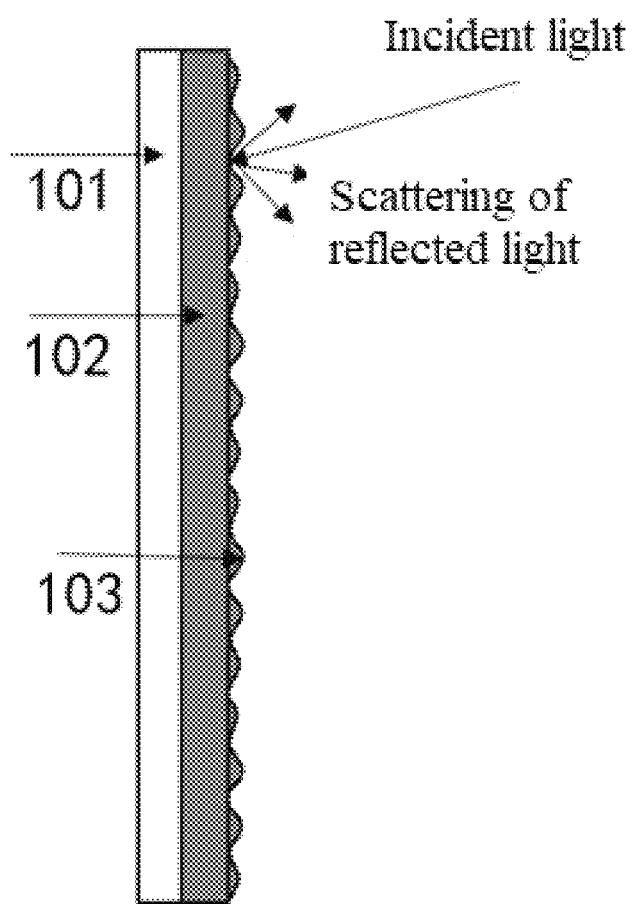
FIG. 1 is a side sectional view of a first structure of a projection screen of the present disclosure.

There is a structure of a projection screen in the prior art, in which a concave-convex structure is provided on the surface of the substrate, and a reflective layer is plated on a surface of the concave-convex structure, so that the reflected light is scattered. However, the process for manufacturing the concave-convex structure is costly and difficult in this technique.

In addition, there is a structure of a projection screen in the prior art, in which a sawtooth microstructure is provided on the surface of the substrate, and a reflective layer and a diffusion layer for reflection and diffusion are formed on the sawtooth microstructure layer. The existing manufacturing method firstly forms a rough surface on the sawtooth micro diffusion layer by etching and sandblasting, i.e., a diffusion layer, and then forms a reflective layer by spray coating, such that the projection light will diffuse at a small angle after passing through the reflective layer. However, the disadvantage of this manufacturing method is in that the sawtooth microstructure layer is easily damaged when forming the rough surface by etching and sandblasting, which greatly reduces the uniformity of the emitted projection light.

Another type of projection screen with diffusion forms a reflective layer on the substrate by spray coating and forms an uneven diffusion layer on the reflective layer. However, since the diffusion layer and the reflective layer are made of different materials and formed by different processes, bonding failure of the reflective layer and the diffusion layer is prone to occur, reducing the reliability of the projection screen.

Hereinafter, specific embodiments of the present disclosure will be described in detail with reference to the accompanying drawings. It should be emphasized that all the dimensions in the drawings are merely schematic and are not necessarily illustrated in true scale, so they are not restrictive. For example, it should be understood that parameters such as dimensions and proportions of the substrate, reflective layer, diffusion layer and other components in the figures are not shown in accordance with the actual sizes and proportions, but are only for the convenience of illustration and do not intend to limit the specific scope of the present disclosure.

<Manufacturing Method of a Projection Screen of the Present Disclosure>

Here, the manufacturing method of the projection screen having a first structure as shown in FIG. 1 will be described.

(1) A substrate is prepared.

(2) With a low sputtering power of 50 W-150 W, a low pressure of 0.3 Pa-1.3 Pa, and a sputtering temperature that is between room temperature to 100° C., a reflective layer 102 is plated on the substrate 101. The thickness of the reflective layer 102 is 10 nm-100 nm.

(3) With a high sputtering power of 100 W-250 W, a high pressure of 1 Pa-3 Pa, and a sputtering temperature of 80°

C.-300° C., a material for forming the reflective layer 102 is grown on a surface of the reflective layer 102 to form a diffusion layer 103.

It should be noted that the room temperature in the above manufacturing method refers to the indoor ambient temperature, at which the vacuum plating process is performed. The indoor ambient temperature is defined to be 20° C.-30° C. under the normal circumstance.

The above preparation conditions for forming the reflective layer 102 and the diffusion layer 103 are only exemplary, and do not intend to limit the present disclosure thereto. It should be noted that the emphases in the present disclosure are to firstly form the reflective layer under a first preparation condition, and then form the diffusion layer 103 with the same material as the reflective layer under a second preparation condition different from the first preparation condition. In this case, the sputtering power in the second preparation condition is greater than the sputtering power in the first preparation condition.

Based on this, those skilled in the art can adopt different preparation conditions as requirements, rather than being limited to the specific data range described above in the present disclosure.

<A First Structure of a Projection Screen of the Present Disclosure>

FIG. 1 is a side sectional view of the first structure of the projection screen of the present disclosure. As shown in FIG. 1, the projection screen includes a substrate 101, a reflective layer 102, and a diffusion layer 103. The reflective layer 102 is a flat film layer and formed on the substrate 101. The diffusion layer 103 is formed on the flat reflective layer 102, and is formed of the same material as the reflective layer 102.

The substrate 101 may be a flexible substrate such as PET, PC, and PVC, or a rigid substrate such as acrylic and glass.

The diffusion layer 103 is a rough structure having island-shaped structures, and the size of each of the island-shaped structures and the spacing between two adjacent ones of the island-shaped structures may be achieved by controlling different parameters in the magnetron sputtering process. The size and spacing of the island-shaped structures on the diffusion layer 103 are controlled based on different process parameters, so that the diffusion angle is capable of being easily controlled.

Since the diffusion layer 103 and the reflective layer 102 are formed of the same material, in the structure of the projection screen shown in FIG. 1, the diffusion layer 103 and the reflective layer 102 are integrally formed without interface therebetween and can be regarded as one layer. The reflective layer and the diffusion layer of the projection screen of the present disclosure are prepared by the same preparation method, both adopting the magnetron sputtering process and the same optical material, which solves the problem of bonding failure of the diffusion layer and the reflective layer in the prior art due to the different materials and different processes thereof <A Second Structure of a Projection Screen of the Present Disclosure>

Figure 2:
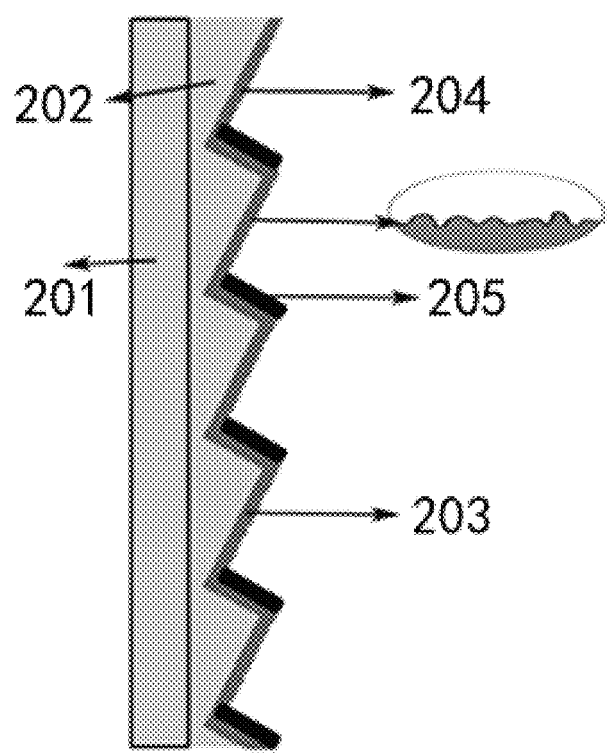
FIG. 2 is a side sectional view of a second structure of a projection screen of the present disclosure.

FIG. 2 is a side sectional view of the second structure of the projection screen of the present disclosure. As shown in FIG. 2, the projection screen includes a substrate 201, a microstructure 202, a reflective layer 203, and a diffusion layer 204. The microstructure 202 is formed on the substrate 201, the reflective layer 203 is formed on the microstructure 202, and the diffusion layer 204 is formed on the reflective layer 203 and is formed of the same material as the reflective layer 203.

The substrate 201 may be a flexible substrate such as PET, PC, and PVC, or a rigid substrate such as acrylic and glass.

The microstructure 202 may be formed of a photocurable resin or a thermal-curable resin.

The reflective layer 203 may adopt highly reflective materials such as silver, aluminum, or chromium, and may also adopt a reflective material with a reflection spectrum that meets the requirements.

The diffusion layer 204 is formed to have a rough structure of island-shaped structures, and the size of each of the island-shaped structures and the spacing between two adjacent ones of the island-shaped structures can be achieved by controlling different parameters in the magnetron sputtering process. The size and spacing of the island-shaped structures on the diffusion layer 303 are controlled based on different process parameters, so that the diffusion angle is capable of being easily controlled.

Since the diffusion layer 204 and the reflective layer 203 are formed of the same material, in the structure of the projection screen shown in FIG. 2, the diffusion layer 204 and the reflective layer 203 are integrally formed without interface therebetween, and can be regarded as one layer. The reflective layer and the diffusion layer of the projection screen of the present disclosure are prepared by the same preparation method, both adopting the magnetron sputtering process and the same optical material, which solves the problem of bonding failure of the diffusion layer and the reflective layer in the prior art due to the different materials and different processes thereof <Manufacturing Method of the Second Structure>

Hereinafter, a manufacturing method of the projection screen with the second structure as shown in FIG. 2 will be described.

The manufacturing method of the second structure is different from the manufacturing method of the first structure in that the second structure has the reflective layer and the diffusion layer formed on the linear prism microstructure 202, that is, the substrate structures of the first and second structures are different from each other.

(1) A photocurable resin or thermal-curable resin is coated and imprinted on the substrate 201 to form the microstructure 202. The microstructure 202 is formed by a plurality of linear prism structures, and each linear prism structure is composed of a first surface and a second surface.

(2) The reflective layer 203 with a uniform thickness is plated on the microstructure 202 by vacuum plating under a first preparation condition. The thickness of the reflective layer 203 is 20 nm-200 nm. In some embodiments, the thickness of the reflective layer 203 is 40 nm-100 nm. The vacuum plating is, for example, magnetron sputtering, thermal evaporation, electron beam evaporation, or the like.

In this embodiment, the first preparation condition is specifically shown in Table 1.

| | |
|---|---|
| Sputtering target | Metal Al (purity: 99.99%) |
| Substrate material | PET |
| Substrate temperature | Room temperature |
| Distance from target to substrate | 120 mm |
| Working gas | Ar (purity: 99.999%) |
| Gas flow rate | 30 sccm |
| Base vacuum degree | 5-10 Pa |
| Deposition vacuum degree | 0.6 Pa |
| Sputtering power | 80 W |
| Sputtering time | 3 min |

Figure 3:
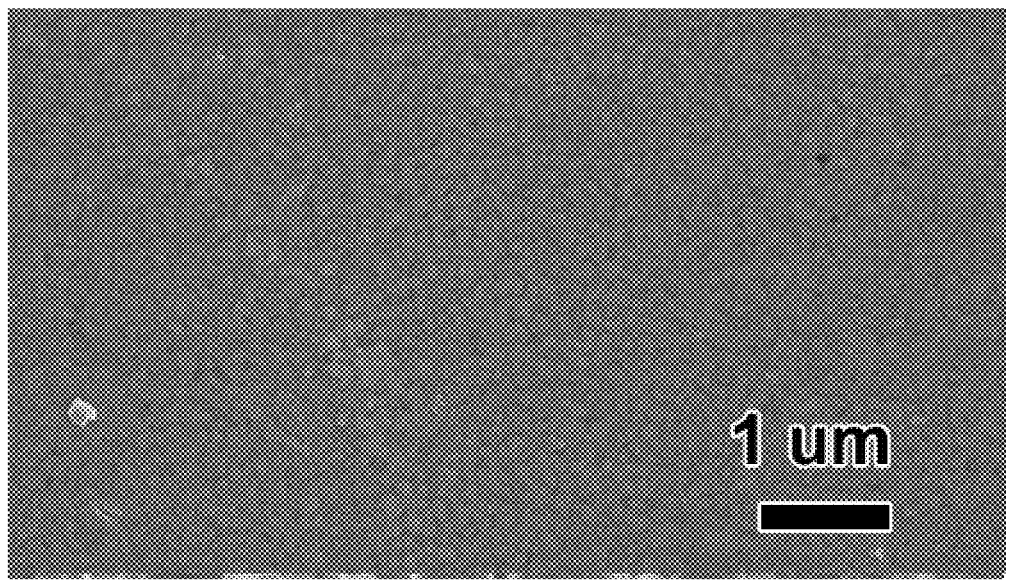
FIG. 3 is a surface scanning electron microscope image of a surface of a reflective layer in the projection screen shown in FIG. 2.

As shown in the surface scanning electron microscope image in FIG. 3, the reflective layer 203 formed on the first surface and the second surface of the microstructure 202 is a flat and dense aluminum film.

Therefore, the reflective layer 203 is also formed in a shape of a microstructure that is formed by a plurality of linear prism structures.

(3) Under a second preparation condition, the material for forming the reflective layer 203 is grown on the reflective layer 203 by magnetron sputtering to form the diffusion layer 204.

In this embodiment, the second preparation condition is shown in Table 2.

| | |
|---|---|
| Sputtering target | Metal Al (purity: 99.99%) |
| Substrate material | PET |
| Substrate temperature | 100° C. |
| Distance from target to substrate | 120 mm |
| Working gas | Ar (purity: 99.999%) |
| Gas flow rate | 50 sccm |
| Base vacuum degree | 5-10 Pa |
| Deposition vacuum degree | 1.6 Pa |
| Sputtering power | 200 W |
| Sputtering time | 3 min |

It should be noted that the room temperature in the above manufacturing method refers to the indoor ambient temperature, at which the vacuum plating is performed. The indoor ambient temperature is defined to be 20-30° C. under the normal circumstance.

Figure 4:
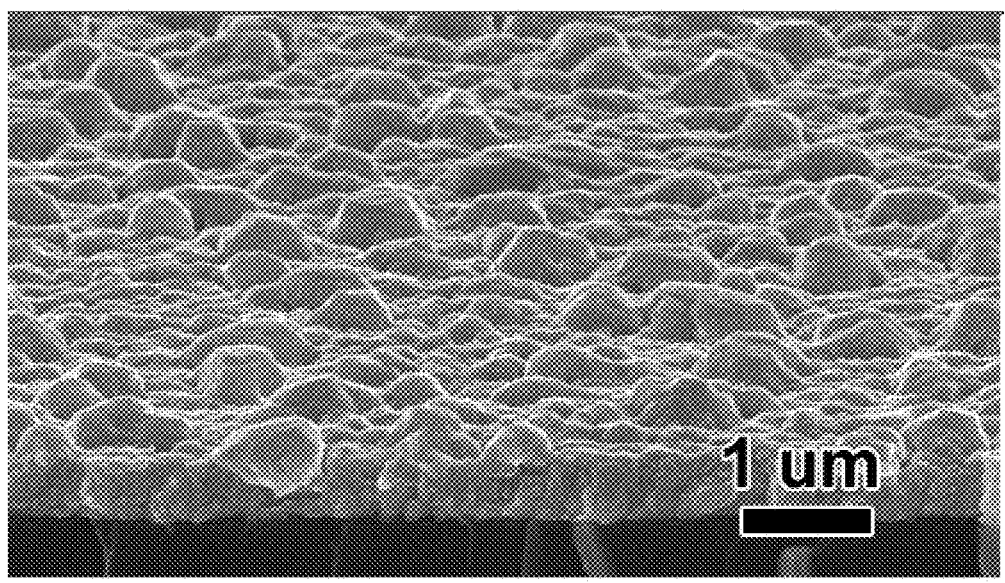
FIG. 4 is a surface scanning electron microscope image of a rough structure on the reflective layer in the projection screen shown in FIG. 2.

As shown in the surface scanning electron microscope image in FIG. 4, the diffusion layer 204 is a rough structure having island-shaped structures, and the size of each of the island-shaped structures and the spacing between two adjacent ones of the island-shaped structures can be achieved by controlling different parameters in the magnetron sputtering process. The size and spacing of the island-shaped structures in the diffusion layer 204 are controlled based on different process parameters, so that the diffusion angle is capable of being easily controlled.

In addition, the substantial structure of the diffusion layer 204 is also formed in a shape of a microstructure that is formed by a plurality of linear prism structures, and each prism structure is also composed of two surfaces.

In the structure of FIG. 2, a light-absorbing layer 205 is formed on the diffusion layer 204 substantially having a microstructure above the first surface of the microstructure 202. However, in the projection screen of the present disclosure, the light-absorbing layer is not essential. Therefore, the projection screen of the present disclosure may not include a light-absorbing layer. It can be understood that, in other embodiments, the light-absorbing layer 205 may also be disposed on the second surface of the microstructure.

The above preparation conditions for forming the reflective layer 203 and the diffusion layer 204 are only exemplary, and do not intend to limit the present disclosure thereto. It should be noted that the emphases in the present disclosure are to firstly form the reflective layer 203 with a uniform thickness on the microstructure under the first preparation condition, and then form the diffusion layer 204 with the same material as the reflective layer under the second preparation condition that is different from the first preparation condition. In this way, the sputtering power in the second preparation condition is greater than the sputtering power in the first preparation condition.

Based on this, those skilled in the art can adopt different preparation conditions as requirements, rather than being limited to the specific data range described above in the present disclosure.

According to the above projection screen structure and the manufacturing method thereof of the present disclosure, the reflective layer and the diffusion layer are formed of the same material and are integrally formed as a composite body that can realize the reflective layer having its own concave-convex structure. Accordingly, an additional diffusion film is not required to be attached or formed on the projection screen, a concave-convex structure is not required to be formed on the substrate by sandblasting, etching, etc., and diffusion particles are not required to be doped in the reflective layer. Therefore, the projection screen of the present disclosure has the beneficial effects of simple manufacturing and low cost.

In addition, the reflective layer and the diffusion layer in the projection screen of the present disclosure are prepared by the same preparation method, both adopting the magnetron sputtering process and the same optical material, which solves the problem of bonding failure of the diffusion layer and the reflective layer in the prior art due to the different materials and different processes thereof.

Those skilled in the art should understand that various modifications, combinations, sub-combinations and changes may be made within the scope of the appended claims of the present disclosure or their equivalents according to design requirements and other factors.

What is claimed is:

1. A method for manufacturing a projection screen, comprising:
   preparing a substrate;
   under a first preparation condition, forming a reflective layer by vacuum plating above the substrate; and
   under a second preparation condition, forming a diffusion layer by the vacuum plating on the reflective layer,
   wherein the second preparation condition is different from the first preparation condition, and a sputtering power in the second preparation condition is greater than a sputtering power in the first preparation condition.

2. The method according to claim 1, wherein the first preparation condition adopts the sputtering power ranging from 50 W to 150 W, an air pressure ranging from 0.3 Pa to 1.3 Pa, and a sputtering temperature that is between room temperature to 100° C., and the second preparation condition adopts the sputtering power ranging from 100 W to 250 W, an air pressure ranging from 1 Pa to 3 Pa, and a sputtering temperature ranging from 80° C. to 300° C.

3. The method according to claim 1, wherein the reflective layer has a thickness ranging from 10 nm to 100 nm.

4. The method according to claim 1, further comprising:
   between the preparing the substrate and the forming the reflective layer by the vacuum plating above the substrate, forming a microstructure on the substrate,
   wherein the microstructure is formed by a plurality of linear prism structures, and each of the plurality of linear prism structures comprises a first surface and a second surface.

5. The method according to claim 4, wherein the microstructure is formed of a photocurable resin or a thermal-curable resin.

6. The method according to claim 4, wherein the reflective layer has a thickness ranging from 20 nm to 200 nm.

7. The method according to claim 4, further comprising:
   after the forming the diffusion layer by the vacuum plating on the reflective layer, forming a light-absorbing layer on one of the first surface and the second surface of the microstructure.

8. The method according to claim 4, wherein the first preparation condition is defined as follows:

a sputtering target is metal aluminum with a purity of 99.99%;
a material for forming the substrate is PET;
a temperature of the substrate is room temperature;
a distance from the sputtering target to the substrate is 120 mm;
a working gas is Ar with a purity of 99.999%;
a gas flow rate is 30 sccm;
a base vacuum degree is within a range of 5 Pa-10 Pa;
a deposition vacuum degree is 0.6 Pa;
the sputtering power is 80 W; and
a sputtering time is 3 min, and
wherein the second preparation condition is defined as follows:
a sputtering target is metal aluminum with a purity of 99.99%;
a material for forming the substrate is PET;
a temperature of the substrate is 100° C.;
a distance from the sputtering target to the substrate is 120 mm;
a working gas is Ar with a purity of 99.999%;
a gas flow rate is 50 sccm;
a base vacuum degree is within a range of 5 Pa-10 Pa;
a deposition vacuum degree is 1.6 Pa;
the sputtering power is 200 W; and
a sputtering time is 3 min.

9. The method according to claim 1, wherein the reflective layer and the diffusion layer are made of a same material and integrally formed.

10. The method according to claim 1 wherein a microstructure surface is formed on the diffusion layer, and a microstructure of the microstructure surface is formed of island-shaped structures.

11. The method according to claim 6, wherein the reflective layer has a thickness ranging from 40 nm to 100 nm.

12. The method according to claim 10, wherein a size of each of the island-shaped structures and a spacing between two adjacent ones of the island-shaped structures is controlled by different parameters in a magnetron sputtering process.

13. A projection screen, comprising:
a substrate;
a reflective layer, the reflective layer being formed by vacuum plating above the substrate under a first preparation condition; and
a diffusion layer, the diffusion layer being formed by the vacuum plating on the reflective layer under a second preparation condition,
wherein the second preparation condition is different from the first preparation condition, and a sputtering power in the second preparation condition is greater than a sputtering power in the first preparation condition.

14. The projection screen according to claim 13, wherein the reflective layer is a flat film layer, and the diffusion layer is formed of a same material as the reflective layer.

15. The projection screen according to claim 13, wherein the diffusion layer is a rough structure having island-shaped structures, and a size of each of the island-shaped structures and a spacing between two adjacent ones of the island-shaped structures are achieved by controlling different parameters in a magnetron sputtering process to control a diffusion angle of the diffusion layer.

16. The projection screen according to claim 13, further comprising:
a microstructure formed on the substrate, wherein the reflective layer is formed on the microstructure.

17. The projection screen according to claim 16, wherein the microstructure is formed by a plurality of linear prism structures, and each of the plurality of linear prism structures is composed of a first surface and a second surface, in such a manner that each of the reflective layer and the diffusion layer is formed in a shape of a microstructure that is formed by a plurality of linear prism structures.

* * * * *